(12) United States Patent
Hayes

(10) Patent No.: US 12,631,706 B2
(45) Date of Patent: May 19, 2026

(54) PREPARING A MAGNETIC RESONANCE IMAGING METHOD

(71) Applicant: Siemens Healthineers AG, Forchheim (DE)

(72) Inventor: Carmel Hayes, Munich (DE)

(73) Assignee: Siemens Healthineers AG, Forchheim (DE)

( * ) Notice: Subject to any disclaimer, the term of this patent is extended or adjusted under 35 U.S.C. 154(b) by 106 days.

(21) Appl. No.: 18/583,951

(22) Filed: Feb. 22, 2024

(65) Prior Publication Data

US 2024/0288522 A1 Aug. 29, 2024

(30) Foreign Application Priority Data

Feb. 23, 2023 (DE) ..................... 10 2023 201 669.9

(51) Int. Cl.
*G01R 33/54* (2006.01)
*G01R 33/483* (2006.01)
*G01R 33/56* (2006.01)

(52) U.S. Cl.
CPC ....... *G01R 33/543* (2013.01); *G01R 33/4835* (2013.01); *G01R 33/5608* (2013.01)

(58) Field of Classification Search
CPC .............. G01R 33/543; G01R 33/4835; G01R 33/5608
See application file for complete search history.

(56) References Cited

U.S. PATENT DOCUMENTS

| | | | |
|---|---|---|---|
| 2016/0245882 A1 | 8/2016 | Popescu | |
| 2016/0291111 A1 | 10/2016 | Pfeuffer et al. | |

FOREIGN PATENT DOCUMENTS

| | | | | |
|---|---|---|---|---|
| DE | 102015203306 A1 | 8/2016 | | |
| DE | 102015205694 B3 | 10/2016 | | |
| DE | 202018006392 U1 * | 3/2020 | ......... | G01R 33/3664 |

OTHER PUBLICATIONS

Machine translation of DE202018006392 (Year: 2020).*

* cited by examiner

*Primary Examiner* — G.M. A Hyder

(74) *Attorney, Agent, or Firm* — Banner & Witcoff, Ltd.

(57) ABSTRACT

A method for preparing a magnetic resonance imaging (MRI) scan of an examination subject may include performing an adjustment prescan of the examination subject, where the adjustment prescan may be performed using a MRI process. The method may include determining adjusted physical parameter values of the MRI scan based on the adjustment prescan and specifying geometric parameter values of the MRI scan based on the adjustment prescan.

16 Claims, 6 Drawing Sheets

3

AO

HK

4

| lc |
| coh |
| lh |

5

| | | | |
| ✓ | | | |
| lbh | | | |
| t1_v | | | |

PREPARING A MAGNETIC RESONANCE IMAGING METHOD

CROSS REFERENCE TO RELATED APPLICATIONS

This patent application claims priority to German Patent Application No. 10 2023 201 669.9, filed Feb. 23, 2023, which is incorporated herein by reference in its entirety.

BACKGROUND

Field

The disclosure relates to a method for preparing a magnetic resonance imaging scan of an examination subject. The method comprises performing an adjustment prescan on the examination subject. The adjustment prescan is performed by applying a magnetic resonance imaging method. The method further comprises determining adjusted physical parameter values of the magnetic resonance imaging scan on the basis of the adjustment prescan. The disclosure also relates to a magnetic resonance imaging method. The disclosure additionally relates to a controller for a magnetic resonance imaging system. The disclosure also relates to a magnetic resonance imaging system.

Related Art

Imaging systems based on a magnetic resonance measurement method, in particular on nuclear spins, referred to as magnetic resonance tomography scanners or magnetic resonance imaging systems, have successfully become established and have proved their worth across a wide range of applications. With this type of image acquisition, a rapidly switched magnetic field, referred to as the gradient field, is in most cases superimposed on a static basic magnetic field $B_0$, which serves for initial alignment and homogenization of magnetic dipoles that are to be examined, for spatial resolution of the imaging signal. In order to determine material properties of an examination subject that is to be imaged, the dephasing or relaxation time following a deflection of the magnetization from the initial alignment is measured so that different material-typical relaxation mechanisms or relaxation times can be identified. The deflection is produced mostly by means of a number of RF pulses (the abbreviation RF stands for radiofrequency), also referred to as excitation pulses, and the spatial resolution is based in this case on a temporally specified manipulation of the deflected magnetization with the aid of the gradient field in a pulse sequence known as a measurement sequence or control sequence, which specifies a precise temporal succession of RF pulses, a precise temporal succession of the variation in the gradient field (by emitting a switching sequence of gradient pulses) and a precise temporal succession of the acquisition of measurement values.

Typically, an association is defined with the aid of an intermediate step between measured magnetization—from which the mentioned material properties can be derived—and a position coordinate of the measured magnetization in the position space in which the examination subject is arranged. In said intermediate step, acquired magnetic resonance raw data, also referred to as k-space data, is arranged at readout points in the spatial frequency domain known as "k-space", the coordinates of the k-space being encoded as a function of the gradient field. The amount of magnetization (in particular the transverse magnetization in a plane at right angles to the above-described basic magnetic field) at a specific position of the examination subject can be determined from the data of the readout point with the aid of a Fourier transform which, from a signal strength (amount of magnetization) which is assigned to a specific frequency (the spatial frequency) or phase angle, calculates a signal strength of the signal in the position space.

Prior to the commencement of an image acquisition by means of magnetic resonance tomography (henceforth referred to also as MR image acquisition or MR scan), a region to be imaged in an examination subject, usually a patient, must be localized in order to enable the required image data to be generated. Such a region to be imaged is referred to as the "region of interest", or "ROI" for short.

An organ or such an ROI is normally localized one step at a time during the magnetic resonance imaging process. In the course of the localization, the field of view, abbreviated as "FoV", of the MR image acquisition (MR is an abbreviation for "magnetic resonance") is merged or brought into congruence with a body region of a patient in which the ROI is assumed to lie.

For this purpose, an image referred to as a localizer image (also known simply as a "localizer") is conventionally acquired with an extended FoV of the patient. Depending on the manufacturer of the magnetic resonance imaging system in question, the localizer image or its acquisition is also called a scout image, locator, plan scan or scanogram. Next, a second, more specific localizer image, for example an organ-specific localizer image, is acquired, for which purpose a subregion or object of interest, for example an organ, is positioned at the central point known as the isocenter, i.e. the axis of symmetry oriented in the longitudinal direction of the gantry of the magnetic resonance imaging system.

The isocenter corresponds to the center of the magnet of the MR system, i.e. the physical coordinates $(x, y, z)=(0,0,0)$ and is the area with the highest $B_0$ field homogeneity and gradient field linearity. During the imaging of an organ such as the heart or liver at the isocenter, this happens roughly in the region of the coordinate $z=0$ of the magnet since there is little scope for modifying the position of the organ along the x-axis and the y-axis on account of the restrictions due to the patient table and the bore size of the magnet, i.e. the object to be examined cannot simply be repositioned horizontally or vertically in the magnet.

In the process, images called view-specific localizer images are acquired. In cases in which the organ or the region to be imaged of the examination subject initially cannot be precisely localized prior to the start of the examination, such as during an imaging of the heart or liver, for example, the first localizer image is acquired at an estimated position. Next, the patient is positioned in the magnet system so that the organ or the subregion of interest that is to be imaged, which is included in the ROI, lies at the isocenter. The basic magnetic field is particularly homogeneous in the region of the isocenter. When the ROI of the examination subject is positioned in the region of the isocenter, an optimal image quality is to be expected owing to the magnetic field homogeneity.

The first localizer image therefore serves to determine the rough Z position or head-foot position of the ROI in order to position the second localizer image and the patient in such a way that the ROI is located in the isocenter in the second localizer image.

As well as the acquisition of one or more localizer images, further prescans are also often performed in addition before the actual MR image acquisition in order to obtain physical parameter values, in particular so-called reference data or reconstruction parameter values. This additional data is required for adjusting an image reconstruction.

For example, multislice imaging sequences are frequently employed for a parallel imaging mode in order to speed up the imaging process by means of the parallel acquisition of raw data and also, for example, to enable images of moving objects to be acquired which, on account of the change in position or dynamics of said moving objects, can be imaged only over a very short acquisition time.

Preparing for such a parallel imaging process necessitates adjustment steps by means of which the mentioned reference data, in particular coil sensitivity values or coil sensitivity profiles of different magnetic field coils or sensor coils, is determined which is required later during the image reconstruction for combining the individual images of the individual sensor coils.

Determining the coil sensitivity values, also referred to simply as coil sensitivities, is the first and most important step in a multislice imaging method based on position space correction, such as the SENSE method, for example. For this purpose, low-resolution images are acquired separately from each sensor coil, for example a surface coil, at full field of view. These surface coil images are normalized by dividing them by a low-resolution body coil image.

Filtering, thresholding and point estimation are then applied to the data in order to generate coil sensitivity profiles, also referred to as coil sensitivity maps. These profiles or maps quantify the relative weighting of signals from different points of origin within the reception area of each sensor coil or surface coil.

A similar approach is also adopted in the technique known as autocalibrated parallel imaging, realized for example by means of the GRAPPA method (GRAPPA stands for GeneRalized Autocalibrating Partial Parallel Acquisition). In this method, missing raw data is calculated by means of a weighted combination of raw data acquired by different sensor coils. For the required weights, reference data, in particular image reconstruction parameter values, is likewise required, which can be obtained as part of an adjustment prescan.

For this adjustment or calibration, a magnetic resonance scan, also referred to as an adjustment scan, is performed with a maximum FoV and at a low resolution. In the process, the geometric parameters of such a magnetic resonance scan are defined by the type of sensor coils used. For example, a FoV with dimensions of 500 mm*500 mm is required for an imaging of the organs of the thoracic cage by means of bodycoil and spine coil fields.

Conventionally, therefore, a number of prescans are performed before the actual imaging, one or two prescans for determining and specifying geometric parameter values, i.e. in particular a correct positioning of the patient and a geometric adjustment of the field of view, and a third prescan in the form of the adjustment scan or adjustment prescan. In addition to the actual imaging, however, these preparatory measures require additional resources, such as, for example, usage time of an MR system, working hours of the specialist staff, etc., which would be better used for the examination of additional patients or additional body parts of the same patient. Furthermore, any delay in an imaging procedure in an emergency situation may also put the life of the patient at risk. Also, patient comfort is limited in the event of a long preparation involving multiple prescans since in this case the patient must remain motionless. Moreover, a protracted examination time increases the risk of a degradation in image quality of the actual MR scan required for examination purposes due to a possible patient movement.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
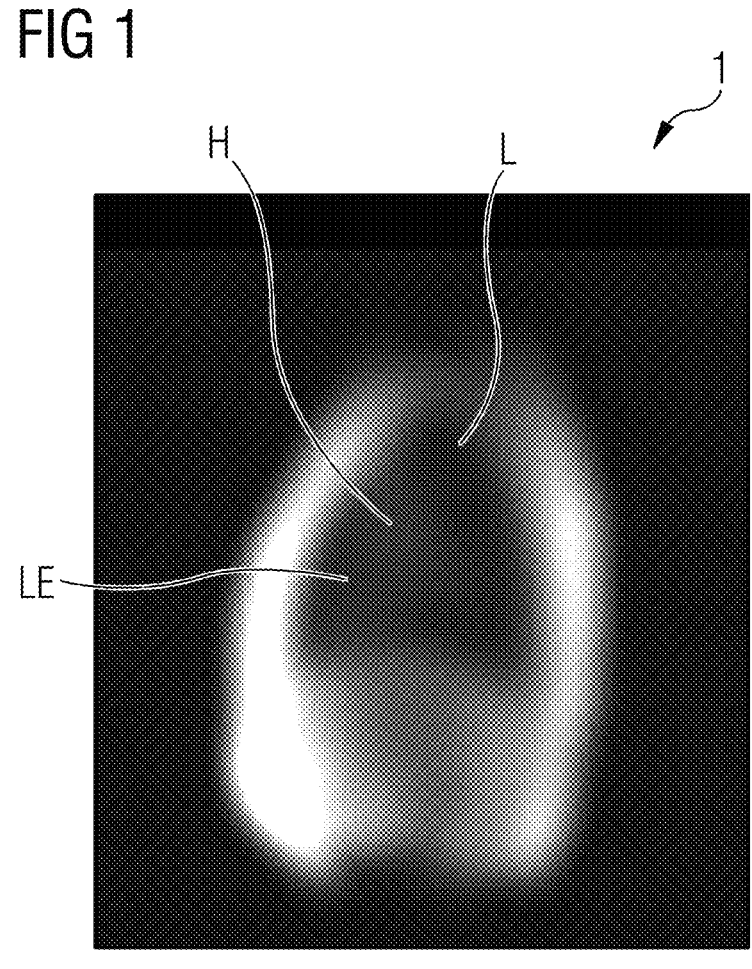
FIG. 1 shows a sagittal view of a torso acquired at low resolution, which view is based on an adjustment prescan for determining coil sensitivity values, according to the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to perform preparatory measures for magnetic resonance imaging which may comprise determining image reconstruction parameters and adjusting geometric parameters, in particular localizing an ROI and adjusting a patient position and/or a FoV, before the start of a parallel magnetic resonance imaging procedure with lower overheads, in particular less expenditure of time, than in the case of a conventional procedure.

This object may be achieved by means of a method for preparing a magnetic resonance imaging scan of an examination subject, by means of a magnetic resonance imaging method, by means of a controller for a magnetic resonance imaging system, and by means of a magnetic resonance imaging system.

In the method according to the disclosure for preparing a magnetic resonance imaging scan of an examination subject, firstly, as already mentioned, an adjustment prescan of the examination subject may be performed by applying a magnetic resonance imaging method to the examination subject. The adjustment prescan may be performed at low resolution in order to save time and also because usually there is no need for a higher resolution for the adjustment step. Such an adjustment prescan conventionally serves for determining reference data in the form of physical parameter values, i.e. in particular image reconstruction parameter values and also more specifically correction parameter values and/or supplementary parameter values. In an exemplary embodiment, the reference data is used to determine real values of physical parameters of the magnetic resonance imaging system which affect an imaging procedure and knowledge of which is required for precise imaging, in particular a determination of correct or additional raw data, a correct image reconstruction and, if necessary, also an image postprocessing step in order to improve the image quality, for example an image homogenization step. The reference data also conventionally determined on the basis of said adjustment prescan may relate for example to actual values which usually deviate from ideal setpoint values of the magnetic resonance imaging system. The cited actual values may describe the real physical behavior of the sensor units and measurement units included in the magnetic resonance imaging system. In contrast, the setpoint values relate to the values set by way of the controller for the cited physical parameters of these sensor units or measurement units. The sensor units or measurement units comprise in particular magnetic field coils for generating the basic magnetic field $B_0$, gradient field coils and the radiofrequency coils for exciting a radiofrequency signal in the examination region and for measuring such a radiofrequency signal. In addition to the described correction and supplementary techniques in the image reconstruction, the adjustment may also comprise the setting of the mentioned setpoint values, specifically in such a way that desired actual values are achieved for the physical parameters of the mentioned sensor units or measurement units.

The mentioned supplementary parameter values as a special form of the physical parameter values are required for determining weights for calculating additional k-space data for supplementing undersampled k-space data for a parallel autocalibrated imaging procedure. With this parallel imaging variant, the "correction" of the artifacts caused by an undersampling takes place already in k-space, missing k-space data being added on the basis of reference data, in particular supplementary parameter values, obtained by means of the adjustment prescan.

It should be explicitly mentioned at this point that the determination of the mentioned physical parameter values, for example the image reconstruction parameter values, the correction parameter values and/or supplementary parameter values, which is part of the described adjustment, does not include the determination and specification of geometric parameter values of a magnetic resonance imaging scan, which conventionally is accomplished by the already mentioned acquisition of localizer images. In contrast to the physical parameter values of the sensor units, these geometric parameter values relate to purely geometric aspects of the imaging process, in particular the positioning, orientation and dimensioning of the field of view or the positioning and dimensioning of the ROI. Parameters or parameter values which relate to the geometry and the arrangement of an acquisition volume of a magnetic resonance imaging scan or which specify these are therefore to be understood as "geometric parameters".

In contrast to the conventional approach, however, the mentioned adjustment scan is not only used for the conventional purpose, namely the purpose of determining the actual values of physical parameters of the magnetic resonance imaging system, in particular the image reconstruction parameter values, but in addition or at the same time also for producing a so-called scout image, i.e. at the same time for specifying geometric parameter values of the subsequent MR imaging scan used for the actual examination of the examination subject.

Since usually it is likewise not necessary for the resolution for such a scout image to be very high, it suffices if outlines of objects that are to be imaged, such as organs, for example, can be recognized, the image data of the adjustment prescan may also be used as a scout image. This succeeds in particular when automated segmentation techniques, such as, for example, an automated segmentation based on machine learning or on AI techniques generally, are applied to this typically low-resolution image data.

It should be noted that the steps of the method according to the disclosure for performing an adjustment prescan, for determining adjusted physical parameter values and for specifying geometric parameter values may be carried out on an automated basis, for example through the use of a computer program in order to keep the workload to a minimum for specialist staff.

Such a specification or adjustment of geometric parameter values of a magnetic resonance scan by a magnetic resonance imaging system is carried out in a preparation step of the actual MR image acquisition which is performed for an examination, in particular a diagnostic examination of an examination subject, such as a patient.

In particular, the specification of these geometric parameters is required for the merging of the field of view and the examination region that is to be imaged. By adapting and specifying the geometric parameters, a correct arrangement or positioning and dimensioning of the field of view of the magnetic resonance imaging system is therefore achieved with the aim of imaging a desired examination region of interest, also referred to as the ROI.

Advantageously, in addition to the determining of physical parameters, the adjustment prescan is at the same time used also for correctly arranging the examination subject in order thereby to achieve a high image quality that is attainable as a result of the placement in the isocenter. Owing to this dual use of the adjustment prescan, it is advantageously possible to dispense with a conventionally performed additional acquisition of a first localizer image and, if necessary, an acquisition of a second localizer image, which are required for aligning the position and the dimensions of the intended examination region with the position and the dimensions of the field of view. Time for additional prescans is therefore saved, as a result of which not only are resources freed up for examinations of other examination subjects, but the examination comfort level of the overall examination is also improved on account of the shorter duration of the preparation of the magnetic resonance imaging scan.

In the magnetic resonance imaging method according to the disclosure, the method according to the disclosure for preparing a magnetic resonance imaging scan of an examination subject is applied initially, i.e. the examination subject is imaged, such as at low resolution, in the course of an adjustment prescan. As already explained, an adjustment of the physical parameter values and the geometric parameter values of a subsequent magnetic resonance imaging scan is carried out in the preparation step. In particular, for the purpose of adjusting the geometric parameter values, the field of view of the magnetic resonance imaging system or, if necessary, the position of the examination subject in the field of view is adjusted so that an examination region to be imaged of the examination subject comes to lie in the isocenter of the magnetic resonance imaging system.

The subsequent magnetic resonance imaging scan for examination purposes then comprises, as usual, an acquisition of raw data of the examination subject on the basis of the determined geometric parameter values.

Finally, as routinely practiced, examination image data of the examination subject is reconstructed on the basis of the acquired raw data as well as on the basis of the adjusted physical parameter values. The image reconstruction is therefore based on physical adjusted parameters or parameter values determined on the basis of the adjustment prescan of the examination subject. In an exemplary embodiment, the reconstructed examination image data may have a higher resolution compared to the image data of the adjustment prescan since said reconstructed data is intended to be usable for examination purposes, in particular diagnostic purposes, and to that end it is usually necessary for details in the examination region to be recognizable. Advantageously, the adjustment prescan is used both for adapting the magnetic resonance imaging system and for an adjusted raw data acquisition and/or image reconstruction so that the number of prescans can be reduced compared to a conventional approach and consequently the overall imaging process is speeded up.

The controller according to the disclosure for a magnetic resonance imaging system is embodied for controlling the magnetic resonance imaging system using the magnetic resonance imaging method according to the disclosure. The controller according to the disclosure comprises a determination unit for determining adjusted physical parameter values of the magnetic resonance imaging scan on the basis of an adjustment prescan and a specification unit for specifying geometric parameter values of the magnetic resonance imaging scan likewise on the basis of the adjustment prescan.

Instead of the mentioned specification unit, the controller according to the disclosure may also comprise a specification device composed of a plurality of components for determining and specifying geometric parameter values, in particular for determining and specifying a field of view.

In one or more aspects, the controller according to the disclosure may include a segmentation unit for segmenting the image data reconstructed on the basis of the adjustment prescan into subsections or segments which are to be assigned to different subregions of the examination subject. The segmentation comprises identifying such a subregion as well as determining the dimensions of the subregion or the boundaries between individual subregions. The segmentation unit may in particular be part of the mentioned specification device.

The specification device may also include a specification unit for specifying the geometric parameters on the basis of an identification and localization and of the dimensions of the segmented subregion.

As will be explained in detail later, the specifying of the geometric parameter values comprises in particular the specifying of the position of the examination subject and the dimensioning of the field of view on the basis of the position and extent of the subregion or segment determined by the segmentation unit.

The controller according to the disclosure shares the advantages of the method according to the disclosure for preparing a magnetic resonance imaging scan of an examination subject.

The magnetic resonance imaging system according to the disclosure comprises the controller according to the disclosure. The magnetic resonance imaging system according to the disclosure shares the advantages of the method according to the disclosure for preparing a magnetic resonance imaging scan of an examination subject.

A largely software-based implementation has the advantage that already existing magnetic resonance imaging systems or their controllers can also be easily upgraded by means of a software update in order to operate in the manner according to the disclosure.

In an exemplary embodiment, some or all of the aforementioned method steps of the method according to the disclosure for preparing a magnetic resonance imaging scan of an examination subject or of the magnetic resonance imaging method according to the disclosure, in particular the determining of adjusted physical parameter values, the specifying of geometric parameter values and the reconstruction of examination image data, but also substeps for performing the adjustment prescan, may be realized wholly or in part in the form of software modules in a processor of a corresponding computing system, e.g. by a controller of a magnetic resonance imaging system or a computer that is used for controlling such a magnetic resonance imaging system.

A largely software-based implementation has the advantage that computing systems already used previously in the prior art can also be easily upgraded by means of a software update in order to operate in the manner according to the disclosure. In this respect, the object is also achieved by means of a corresponding computer program product comprising a computer program which can be loaded directly into a computing system and has program sections for performing the mentioned steps of the method according to the disclosure for preparing a magnetic resonance imaging scan of an examination subject or of the magnetic resonance imaging method according to the disclosure when the program is executed in the computing system. In addition to the computer program, such a computer program product may, where appropriate, comprise additional constituent parts, such as e.g. a set of documentation, and/or additional components, including hardware components, such as e.g. hardware keys (dongles, etc.) to enable use of the software.

A computer-readable medium, e.g. a memory stick, a hard disk drive or some other transportable or permanently installed data medium, on which the program sections of the computer program that can be read in and executed by a computing system are stored, can serve for transporting the computer program product to the computing system or to the controller and/or for storing the same on or in the computing system or the controller. For this purpose, the computing system can have e.g. one or more cooperating microprocessors or the like.

In an exemplary embodiment, the mentioned adjustment prescan may have a low resolution compared to the resolution of the subsequent MR image acquisition which is performed for examination purposes, but still provides an image quality that is adequate for identifying and localizing, and also for segmenting an examination region. The minimum requirements in terms of image quality may be met by the achieved resolution and the achieved contrast of the image data reconstructed on the basis of the adjustment prescan, which must be sufficient to enable individual sub-regions of the examination subject to be identified, localized and if necessary also segmented.

In the course of the adjustment prescan of the method according to the disclosure for preparing a magnetic resonance imaging scan of an examination subject, raw data from an acquisition volume of the magnetic resonance imaging system may be acquired. On the basis of the acquired raw data, prescan image data is then reconstructed at a lower resolution compared to the resolution of the subsequent MR imaging scan performed for examination purposes.

In contrast to the conventional approach, in the method according to the disclosure for preparing a magnetic resonance imaging scan of an examination subject, geometric parameter values of the following magnetic resonance imaging scan are specified on the basis of the reconstructed image data of the adjustment prescan at low resolution. As will be explained in more detail later, an examination region of the examination subject may be localized and identified in an automated manner for this purpose. The automated identification comprises the locating of a desired examination region in the examination subject or in the image of the adjustment prescan. The localization comprises determining a position of said examination region in the adjustment prescan image. Finally, the mentioned geometric parameters of the following magnetic resonance imaging scan are adjusted on the basis of said localized position of the examination region. For this purpose, a position of the examination subject can be adjusted for example in such a way that the examination region of the examination subject includes the isocenter of the magnetic resonance imaging system in order in this way to optimize the image quality of the following imaging procedure.

In an exemplary embodiment of the method according to the disclosure for preparing a magnetic resonance imaging scan of an examination subject, the correction parameter values may comprise coil sensitivity parameter values. Advantageously, the prescan required in particular in the case of parallel imaging in order to determine coil sensitivity values can be used in addition for adjusting or specifying the geometric parameters of the subsequent magnetic resonance imaging scan, thereby enabling otherwise necessary separate localizer image prescans to be dispensed with.

In the course of the parallel MR imaging procedure using multiple sensor coils, the mentioned coil sensitivity values are required for the image reconstruction in order, figuratively speaking, to combine the signals captured by the differently positioned sensor coils correctly with one another and to generate an overall image of the examination region.

In addition to the image reconstruction, in particular during artifact correction in the image space, such as, for example, in the SENSE imaging method, coil sensitivity values can also be used for image homogenization in the course of the editing of the image data.

However, it should be expressly mentioned at this point that the adjustment prescan may (but not necessarily) comprise an acquisition of raw data for determining coil sensitivity values. Other types of adjustment prescans can for example include adjustment prescans for generating $B_0$ field maps for measuring the basic magnetic field. For this purpose, magnetic resonance data is typically acquired at two different echo times. The phase difference of the magnetic resonance data acquired at different echo times is then proportional to a deviation of the local $B_0$ field from the nominal basic magnetic field strength.

As already mentioned, the image reconstruction parameter values obtained during the preparation of the magnetic resonance imaging scan on the basis of the adjustment prescan may also include supplementary parameter values which may comprise weights for calculating additional k-space data for supplementing undersampled k-space data for a parallel autocalibrated imaging procedure.

With this method, missing raw data is calculated by a weighted combination of raw data acquired from different sensor coils. Reference data, in particular supplementary parameter values, obtained in the course of an adjustment prescan is likewise needed for the required weights.

In an exemplary embodiment of the method according to the disclosure for preparing a magnetic resonance imaging scan of an examination subject, the geometric parameter values comprise special parameter values for merging the field of view of the magnetic resonance imaging scan and an examination region to be imaged of the examination subject. By specifying the geometric parameter values, it is advantageously achieved that during the following imaging the field of view comes to lie on the examination region to be imaged, such that the desired examination region of interest is imaged.

This convergence of the field of view of the magnetic resonance imaging scan and an examination region to be imaged of the examination subject may comprises the specification of the field of view of the magnetic resonance imaging scan, i.e. in particular the positioning thereof, and/or an adjustment of the position of the examination subject to a position of the field of view. The examination subject can advantageously be positioned so that the field of view is brought into alignment with the desired examination region. In this case it is advantageous in order to achieve the best possible image quality if the field of view and hence also the examination region are located in the isocenter of the magnetic resonance imaging system used for the following magnetic resonance imaging scan.

In an exemplary embodiment, the merging of the field of view and of the examination region to be imaged of the examination subject may include an automatic identification and localization of the examination region on the basis of the adjustment prescan, i.e. in particular on the basis of the prescan image data. Advantageously, therefore, spatial information about the examination region is obtained in the first instance in order to specify the geometric parameter values on the basis of this information or to merge the field of view with the examination region to be imaged.

The dimensions of the examination region may also be determined on the basis of the image data of the adjustment prescan and the size of the field of view is established as a function of the dimensions. In this way it is advantageously possible to determine not only the correct centering of the field of view but also the dimensions thereof simultaneously with other adjustment data, thereby saving time in the preparation of an MR imaging scan.

In an exemplary embodiment of the method according to the disclosure for preparing a magnetic resonance imaging scan of an examination subject, at least one individual subobject and/or at least one subregion of the examination region are/is identified and/or localized and/or segmented in the examination region on the basis of the image data, a position and an extent of the subregion and or of the subobject being determined. A clearly delimitable subunit of an examination subject, in particular an organ, a bone or a skeleton segment, a muscle or another tissue segment, is to be understood as a subobject. Individual subregions or subobjects of an examination subject can advantageously be focused on or the imaging can be coordinated with their position and dimensions.

In particular the imaging of individual organs of a patient, such as e.g. the heart or the liver, whether the patient be a human being or an animal, requires a localization of the organ in question and a matching of the dimensions of the field of view to the dimensions of the organ in question. A z-offset of the sub-object may be determined during this matching process.

The term z-offset makes reference to the position of the organ along the z-axis of the magnet of the basic magnetic field $B_0$. The organ should be centered at position z=0 of the magnet (isocenter). In the case of the heart, the midpoint of the left ventricle is typically chosen as the optimal position for centering the heart in the isocenter of the magnet. In the case of the liver, the central position is chosen such that the liver is centered in a sagittal or coronal view within the limits of the planned slice or volume, the upper edge being defined by the top surface of the liver and the boundary toward the lung.

The position of the examination subject may be adjusted as a function of the determined position and extent of the object. The examination subject can advantageously be aligned or positioned such that the object standing at the center of interest of an examination lies in the field of view of the MR imaging scan.

As already explained, it is particularly advantageous if the position of the examination subject is adjusted in such a way that the examination region of the examination subject comprises the isocenter of the magnetic resonance imaging system because then the image quality of the image data generated for examination purposes is particularly high.

The specification of the field of view may comprise not only the positioning but also the dimensioning of the field of view as a function of the dimensions of the examination region. The field of view can advantageously be dimensioned such that the examination region is imaged in its entirety.

The dimensioning of the field of view can also be performed as a function of the position and the dimensions or the extent of the subobject or subregion to be imaged. The field of view may be therefore positioned and dimensioned so that the subobject or subregion is imaged in full at a desired position, in particular the isocenter, in a following magnetic resonance imaging scan. Furthermore, the field of view can be limited relative to the extent of the overall examination subject in such a way that the duration and the raw data volume and image data volume of the imaging procedure are reduced to a minimum by restricting the field of view to the subobject or subregion to be imaged, as a result of which the time required for an image acquisition of a patient is also limited to the necessary minimum.

In order to produce the prescan, at least one slice view may be generated based on the adjustment prescan. In this specific variant, specifying the field of view comprises a determining of the position and/or the orientation and/or a dimensioning of the field of view on the basis of at least one of the slice views. If multiple slice views are acquired from multiple directions, this makes it easier to localize and segment an examination region or subregion or subobject in the adjustment prescan.

In an exemplary embodiment, the cited slice view may include:

a sagittal view, a coronal view, and/or a transverse view.

The cited views are the standard views for a medical imaging scan. The field of view can advantageously be positioned and dimensioned on the basis of these views. In other words, the position and/or orientation and/or dimensioning of the field of view are/is determined particularly comprehensively and precisely on the basis of the mentioned views since the extent of a region to be imaged from the different directions can be recognized particularly clearly.

The examination region of the examination subject is particularly effectively identified and localized by applying an AI-based algorithm. Advantageously, even objects that are difficult to detect in an examination region, in particular organs, can be identified and localized if the AI-based algorithm has been adapted in advance for its task by means of suitable training data. Such training data comprises labeled adjustment prescans of an examination region. As result data or labels, the image data of the adjustment prescans comprises details relating to subobjects, such as, for example, organs in the image data and their position and extent. If this image data may be used as training data for the AI-based algorithm, then it is possible, by repeated application of the AI-based algorithm for identifying and localizing individual subobjects and on the basis of a comparison between the result data of the algorithm and the result data of the labeled adjustment prescans, to achieve an iterative fitting of the AI-based algorithm to the training data used. Such an AI-based algorithm for identifying, localizing and segmenting objects in an examination region can be employed particularly flexibly by comparison with a rigid model.

controller FIG. 1 illustrates a sagittal view 1 of a thoracic cage or torso at low resolution, which view is based on an adjustment prescan for determining coil sensitivity values. However, the lung L at top right, the liver LE at bottom left and the heart H at top left are only perceptible as blurred in FIG. 1. In the method according to the disclosure for preparing a magnetic resonance imaging scan of an examination subject, in addition to being used to determine the coil sensitivity values, this image of the thoracic cage is now also intended to serve for specifying a field of view for a following magnetic resonance imaging scan of the thoracic cage at higher resolution. In particular, an organ that is to be imaged is to be identified and localized and the field of view is to be aligned to the position of the organ and its dimensions.

Figure 2:
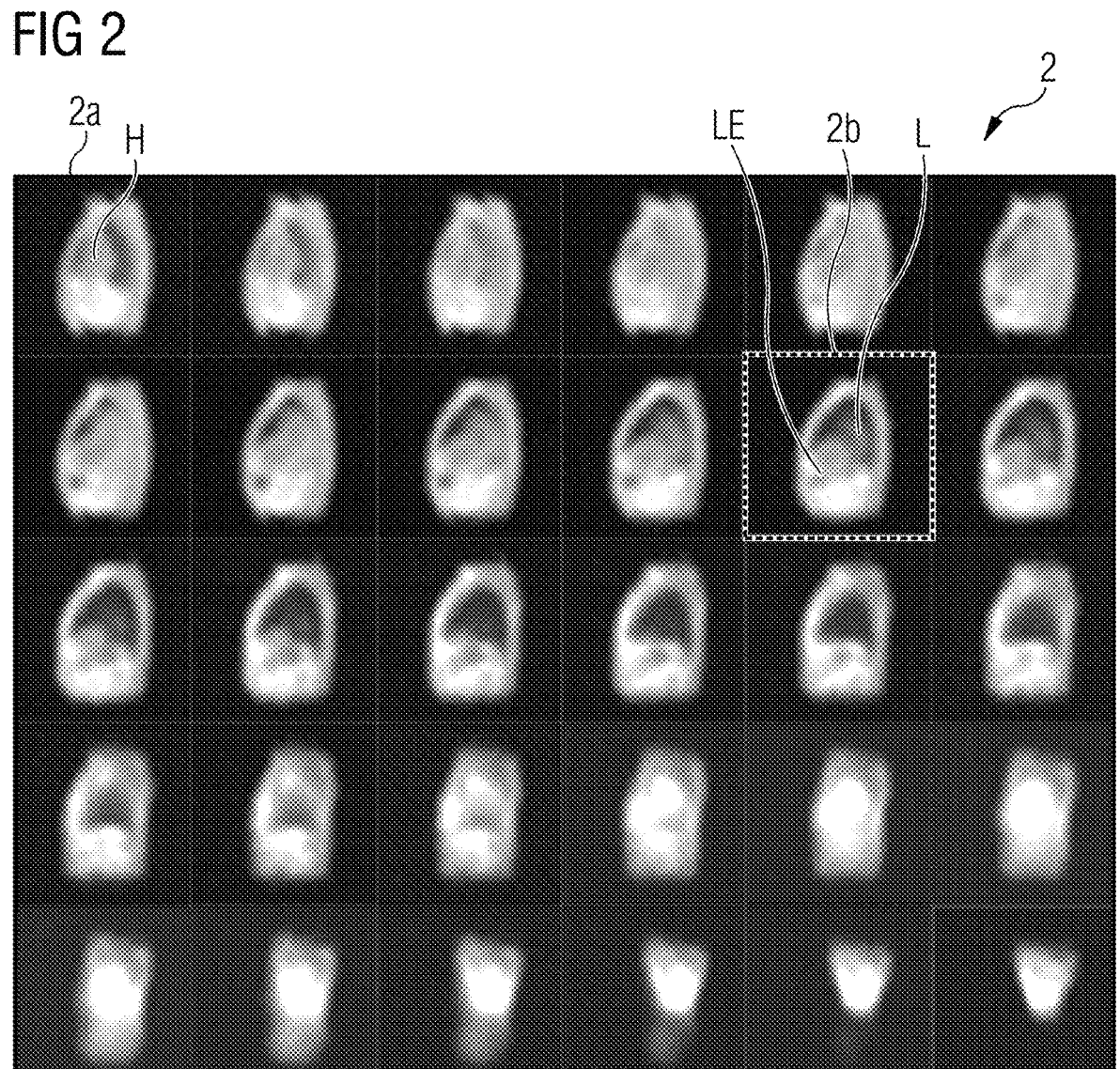
FIG. 2 shows multiple sagittal slice views of a torso acquired at low resolution, which views are based on an adjustment prescan for determining coil sensitivity values, according to the disclosure.

FIG. 2 shows multiple adjustment images 2 in the form of sagittal slice image views or sectional views of a torso at low resolution. The individual slice images are assigned to different slices, the surface sides of which are arranged parallel to the sagittal plane. The slice images are based on adjustment prescans for determining location-dependent coil sensitivity values of different sensor coils. Depending on the choice of the slice to be imaged, individual organs can be recognized better than is the case in FIG. 1. For example, the heart H can be recognized in a first slice image 2a in the first row at top left in the torso. In contrast, the lung L at top right in the torso and the liver LE at bottom left in the torso can be seen in a framed slice image 2*b* in the second row. In addition to the generation of these slice images for the purpose of adjusting physical parameters, in particular for determining coil sensitivity values, further images are conventionally acquired also for localizing these organs at higher resolution.

Figures 3, 4, 5:
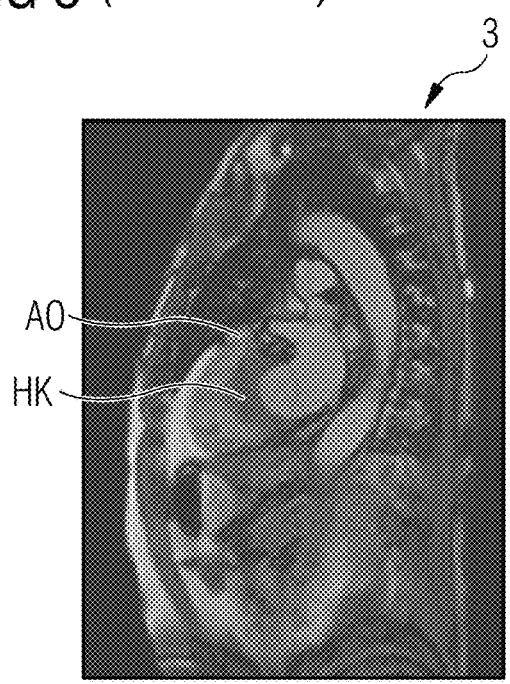
FIG. 3 shows a sagittal slice view of a torso based on a localizer image for preparing the imaging of a heart comprising a view of the ventricles of the heart and the aorta, according to the disclosure.
FIG. 4 shows a menu schematic of a computer program for a magnetic resonance imaging scan of the heart, according to the disclosure.
FIG. 5 shows a menu schematic of a computer program for a magnetic resonance imaging scan of the liver, according to the disclosure.

FIG. 3 shows such a localizer image 3 in the form of a sagittal view of a torso for preparing the imaging scan of a heart comprising a view of the ventricles of the heart HK and the aorta AO. Instead of the localizer image 3 shown, in the method according to the disclosure for preparing a magnetic resonance imaging scan of an examination subject, the slice images shown in FIG. 1 and FIG. 2, which are based on an adjustment prescan, are also to be used for localizing the organs and specifying the field of view.

FIG. 4 shows a menu schematic 4 representing a button of a computer program for controlling a magnetic resonance imaging system for an examination of the heart. By means of the method according to the disclosure, a first menu item "localizer" (abbreviated as "lc" in FIG. 4) for generating a first localizer image can advantageously be skipped and also, if necessary, so can the manual centering on the heart "center on heart" (abbreviated as "coh" in FIG. 4), which forms a second menu item, if the localization of the heart and the centering of the field of view around the heart are accomplished by applying the method according to the disclosure for preparing a magnetic resonance imaging scan of an examination subject. The imaging process can therefore start immediately at the third menu item "localizer heart" (abbreviated as "lh" in FIG. 4). At this third menu item, a second localizer image is generated with a field of view already focused on the heart. The second localizer image enables the field of view to be coordinated exactly with the examination region to be imaged.

FIG. 5 shows a schematic 5 representing a button of a computer program for controlling a magnetic resonance imaging system for an examination of the liver. By means of the method according to the disclosure, the first menu item "localizer_bh" (abbreviated in FIG. 5 as "lbh"=localizer breathhold=localizer image acquired while breath is held) can advantageously be skipped since it is intended to be used only for positioning the so-called 3D VIBE volume. This step can be automated and integrated into the adjustment of the ROI.

The examination sequence of a liver MR examination may differ significantly from that of a heart examination. In the case of a heart examination, current practice consists in obtaining sectional images called 2D slices of specific heart views in contrast to a large 3D volume. This is due to the intrinsic difference between a heart and a liver-a heart beats continuously and a liver does not. Consequently, the imaging of the heart typically requires a triggering and holding of the breath in order to compensate for the movement of the heart and respiratory motion. The imaging of the liver requires a compensation for respiratory motion. As a result, 2D imaging is more efficient for imaging the heart since it allows the acquisition of clinically representative images in a shorter time frame than 3D imaging. However, variations of this workflow sequence are possible both for the imaging of the heart and for the imaging of the liver. It is therefore also conceivable to acquire 3D volumes of the heart or 2D slices of the liver at the start of the examination.

When the method according to the disclosure is used for a liver imaging scan, it is therefore possible to start straight away with the second menu item. The second menu item relates to the actual imaging method for the liver examination designated "t1_vibe_e-dixon_tra_bh_pre", abbreviated as "t1_v" in FIG. 5. The designation "t1_vibe_e-dixon_ tra_bh_pre" stands for "transverse T1-weighted volumetric breathhold examination using a Dixon sequence performed before contrast administration".

"Transverse" relates to the geometric alignment of a slice or a volume of interest. The transverse plane corresponds to a plane perpendicular to the longitudinal axis of the body.

The volumetric interpolated breathhold examination (abbreviated as VIBE) is a form of volumetric imaging using fast 3D gradient echo sequences to generate T1 images. It has the advantage that the resolution of the z-axis is improved, which enables high-quality multiplanar and 3D reconstruction images to be obtained. VIBE has been effectively employed in stomach and breast imaging, where short "breathhold" acquisitions, typically less than 30 s, are required in order to obtain a dynamic, high-resolution T1-weighted tissue imaging process which is only minimally affected by respiratory movements. Compared to standard T1-weighted images, VIBE sequences are characterized by lower signal properties of the fluid, though otherwise the symptoms are similar as in the case of standard T1-weighted images. Dixon sequences are suitable for fat suppression.

Figure 6:
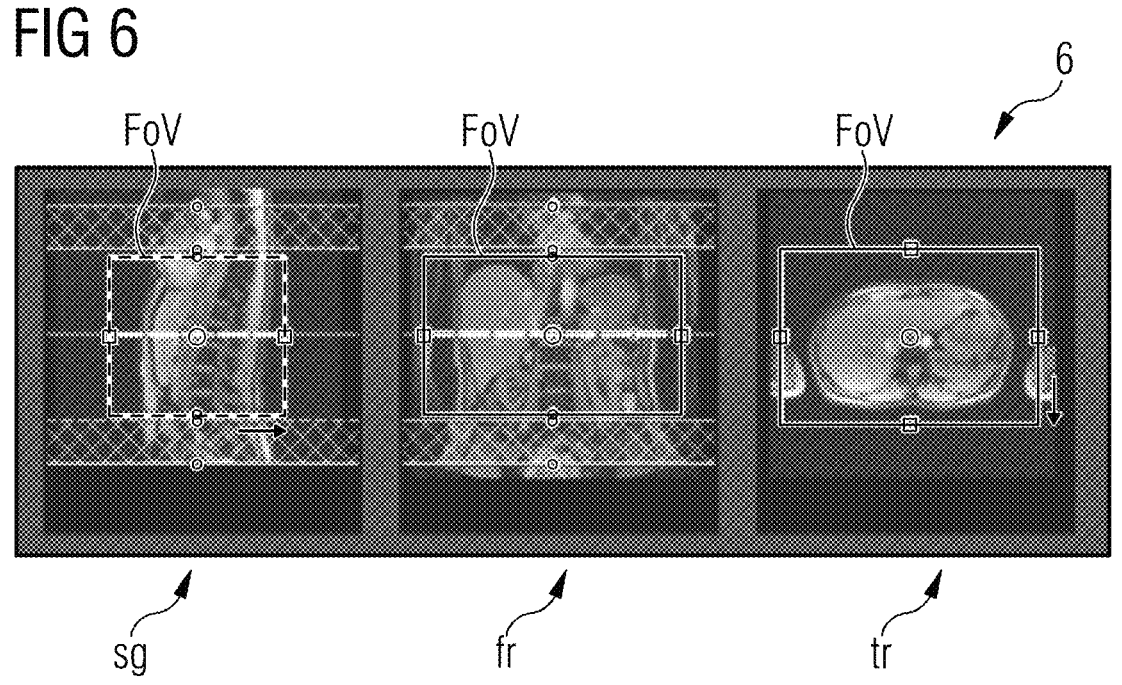
FIG. 6 shows a representation of a specification of the field of view of a magnetic resonance imaging scan on the basis of localizer images, according to the disclosure.

FIG. 6 shows a view 6 which illustrates a positioning and dimensioning of a field of view FoV for imaging an examination region of interest ROI on a localizer image from three different perspectives (sagittal sg, frontal fr and transverse tr). This step follows the generation of a localizer image, i.e. for example the first menu item "l_bh" of the schematic 5 shown in FIG. 5. This step can likewise be realized by means of the method according to the disclosure for preparing a magnetic resonance imaging scan of an examination subject, thus enabling imaging to commence at step t1_v (see FIG. 5) immediately after the adjustment prescan.

Figure 7:
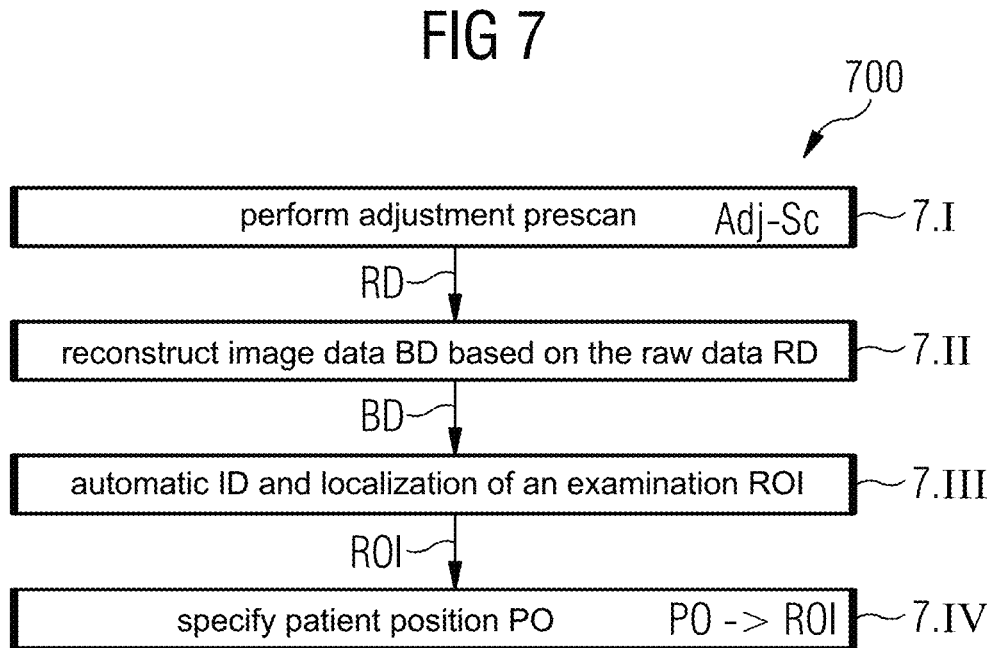
FIG. 7 shows a flowchart of a method for preparing a magnetic resonance imaging scan of an examination subject according to the disclosure.

FIG. 7 shows a flowchart 700 which illustrates a method for preparing a magnetic resonance imaging scan of an examination subject according to an exemplary embodiment of the disclosure.

At step 7.I, an adjustment prescan Adj-Sc is first performed for determining coil sensitivity parameter values. In the course of this one adjustment prescan Adj-Sc, raw data RD is acquired from an acquisition volume of a magnetic resonance imaging system 100 (see FIG. 9).

At step 7.II, image data BD is reconstructed on the basis of the acquired raw data RD. This image data BD is now used both for adjusting a subsequent image reconstruction and as a replacement for a localizer image.

At step 7.III, an automatic identification and localization of an examination region of interest ROI of the examination subject is therefore carried out on the basis of the image data BD.

At step 7.IV, finally, a patient position PO is specified in such a way that the examination region of interest ROI of the examination subject comprises the isocenter of the magnetic resonance imaging system. The field of view FoV is furthermore specified such that it covers the examination region of interest ROI in the isocenter and consequently an optimal image quality is achieved in a following image acquisition of the examination region of interest ROI.

Figure 8:
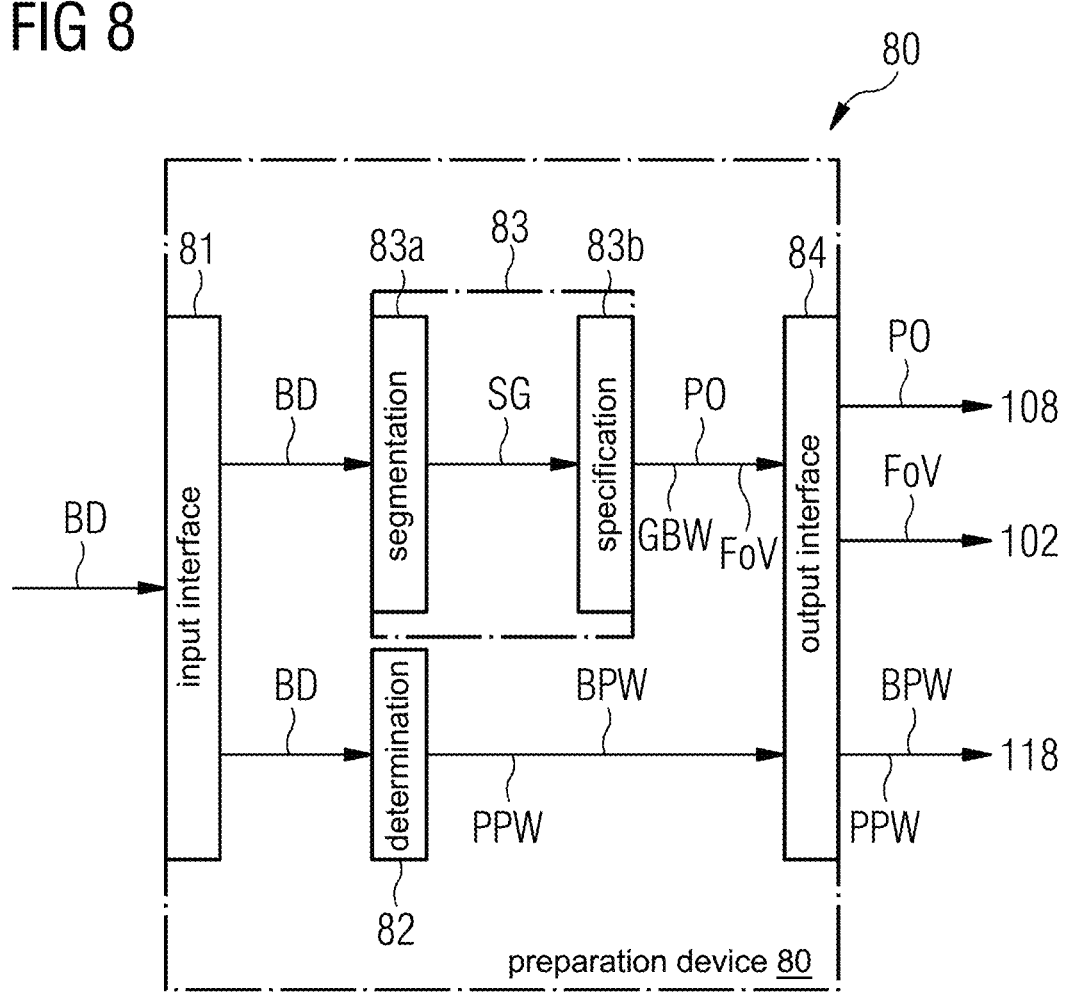
FIG. 8 shows a schematic representation of a controller according to the disclosure.

FIG. 8 shows a schematic representation of a preparation device 80 according to an exemplary embodiment of the disclosure.

The preparation device 80 comprises an input interface 81 for receiving image data BD from an adjustment prescan. In an exemplary embodiment, the preparation device 80 (and/ or one or more components therein) may include processing circuitry configured to perform one or more functions and/or operations of the preparation device 80 (and/or of the respective component(s)).

The preparation device 80 may include a determination unit 82 (at bottom in the figure) configured to determine adjusted physical parameter values PPW, such as for determining image reconstruction parameter values BPW for a following magnetic resonance imaging scan on the basis of the image data BD of the adjustment prescan Adj-Sc. The adjusted physical parameter values PPW, in particular the adjusted image reconstruction parameter values BPW, are forwarded to a reconstruction unit 118 (see FIG. 9) via an output interface 84.

The preparation device 80 may also include a specification device 83 for specifying geometric parameter values GPW, in particular for specifying a field of view FoV and a position PO of an examination subject O, likewise on the basis of the adjustment prescan Adj-Sc.

The specification device 83 may comprise a segmentation unit 83*a* configured to segment the image data BD reconstructed on the basis of the adjustment prescan Adj-Sc into subregions or segments SG which are to be assigned to different organs or subregions of the body of a patient. The segmentation may comprise identifying such a subregion as well as determining the dimensions of the subregion or the boundaries between individual subregions.

The specification device 83 may also comprise a specification unit 83*b* configured to specify or otherwise determine the geometric parameter values GPW, in particular the position PO of the examination subject O, and for dimensioning the field of views FoV on the basis of the position POS and extent of the segment SG determined by the segmentation unit 83*a*. The specified position PO may be output via an output interface 84 to a unit for controlling a patient table 108 (see FIG. 9) in order to move the patient O (see FIG. 9) to the specified position PO. The information relating to the field of view FoV may be forwarded from the output interface 84 to a magnetic resonance scanner 102 (see FIG. 9) in order to adjust the specified field of view FoV for a following magnetic resonance imaging scan.

Figure 9:
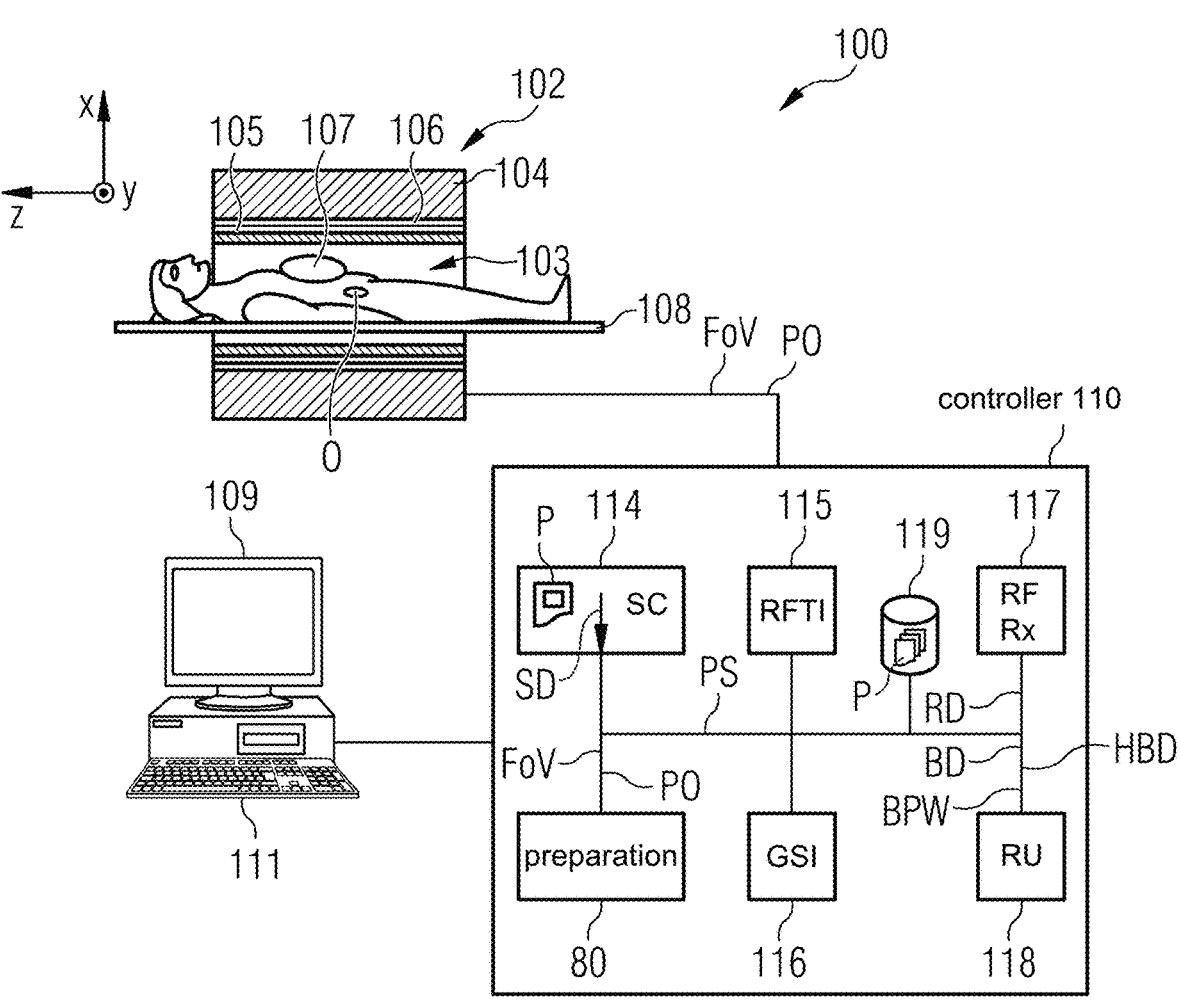
FIG. 9 shows a schematic representation of a magnetic resonance imaging system according to the disclosure.

FIG. 9 shows a roughly schematic representation of a magnetic resonance imaging system 100 according to the disclosure (referred to in the following as "MR system" for short). It comprises firstly the actual magnetic resonance scanner 102 with an examination chamber 103 or patient tunnel into which it is possible to introduce an examination subject O positioned on a couch 108, in this case a patient or test volunteer, in whose body a specific organ that is to be imaged is located, for example.

The magnetic resonance scanner 102 is equipped in the customary manner with a basic field magnet system 104, a gradient system 106 as well as an RF transmit antenna system 105 and an RF receive antenna system 107. In the exemplary embodiment shown, the RF transmit antenna system 105 is a bodycoil permanently integrated in the magnetic resonance scanner 102, whereas the RF receive antenna system 107 consists of local coils that are to be arranged on the patient or test volunteer (said coils being symbolized in FIG. 9 by just a single local coil). Basically, however, the bodycoil 105 can also be used as an RF receive antenna system and the local coils 107 as an RF transmit antenna system provided said coils can be switched over in each case into different modes of operation.

The MR system 100 additionally comprises a central control device (central controller) 110 which is configured to control the MR system 100. The central controller 110 may include a sequence controller 114 for pulse sequence control. With the sequence controller 114, the temporal succession of radiofrequency pulses (RF pulses) and gradient pulses may be specified in accordance with a chosen imaging sequence PS. Such an imaging sequence PS can be predefined for example within a measurement or control protocol P. Different control protocols P for different measurements are typically stored in a memory 119 and can be selected (and possibly modified if necessary) by an operator and then used for conducting the measurement. In an exemplary embodiment, the controller 110 (and/or one or more components therein) may include processing circuitry configured to perform one or more functions and/or operations of the controller 110 (and/or of the respective component(s)).

In order to output the individual RF pulses, the central controller 110 may include a radiofrequency transmitter 115 which generates the RF pulses, amplifies them and feeds them via a suitable interface (not shown in detail) into the RF transmit antenna system 105. To control the gradient coils of the gradient system 106, the controller 110 has a gradient system interface 116. The sequence controller 114 communicates in a suitable manner, e.g. by transmitting sequence control data SD, with the radiofrequency transmitter 115 and the gradient system interface 116 for transmitting the pulse sequences PS. The controller 110 may also include a radiofrequency (RF) receiver 117 (likewise communicating in a suitable manner with the sequence controller 114) in order to acquire magnetic resonance signals received in a coordinated manner from the RF receive antenna system 107. Following demodulation and digitization, a reconstruction unit 118 accepts the acquired data as raw data or k-space data RD and reconstructs the MR image data BD, HBD therefrom. This image data, for example low-resolution image data BD for preparing an image acquisition or examination image data HBD, can then be stored for example in a memory 119 or be evaluated by the preparation device 80 or displayed via a display unit 109.

The central controller 110 can be operated by way of a terminal comprising an input unit 111 (e.g., keyboard, mouse, touchscreen, etc.) and the output unit 109 (e.g., display, speaker, output interface, etc.). Using the terminal, the entire MR system 100 may be controlled by an operator. MR images can also be displayed via the output unit 109, and measurements can be planned and started by means of the input unit 111, if necessary in combination with the output unit 109, and in particular suitable control protocols containing suitable measurement sequences as explained above can be selected and modified if necessary.

Also shown in FIG. 9 is the preparation device 80 already illustrated in FIG. 8. The preparation device 80 may be configured to process image data BD generated in the course of an adjustment prescan of the patient O. The preparation device 80 may also control the magnetic resonance scanner 102, and in particular the patient table 108, in order to set the patient position PO in such a way that a subregion of the patient O that is to be imaged in a subsequent magnetic resonance scan coincides with the isocenter of the magnetic resonance scanner. Furthermore, the field of view FoV of the magnetic resonance system may also be specified by the preparation device 80 in such a way that the subregion to be imaged is included in the field of view and is acquired in images at an optimal resolution.

The MR system 100 according to the disclosure and in particular the controller 110 can furthermore comprise a plurality of further components, not shown here specifically but typically present on such devices, such as, for example, a network interface in order to connect the overall system to a network and to enable raw data RD and/or image data BD, HBD, but also other data such as, for example, patient-related data or control protocols, to be exchanged.

How suitable raw data RD can be acquired by radiating RF pulses and generating gradient fields and how MR images BD can be reconstructed therefrom is generally known to the person skilled in the art and is not explained in further detail here.

It is clear from the foregoing description that the disclosure effectively provides opportunities for improving a method for controlling a magnetic resonance imaging system for the purpose of generating magnetic resonance image data with regard to the required duration.

It should be pointed out in this context that the features of all of the exemplary embodiments or of developments disclosed in figures can be used in any desired combination.

In conclusion, it is pointed out once again that the methods and structures described in detail in the foregoing are exemplary embodiments and that the basic principle can also be varied in many respects by the person skilled in the art without leaving the scope of the disclosure insofar as this is defined by the claims. The exemplary embodiments illustrated in the description of the figures therefore serve primarily for illustration purposes and in no way limit the scope of protection of the claims to the specific type of imaging described there. For the sake of completeness it is also pointed out that the use of the indefinite articles "a" or "an" does not exclude the possibility that the features in question may also be present more than once. Similarly, the term "unit" does not rule out the possibility that this consists of a plurality of components which if necessary may also be distributed in space. Independent of the grammatical term usage, individuals with male, female or other gender identities are included within the term.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for preparing a magnetic resonance imaging (MRI) scan of an examination subject, the method comprising:

performing, by a controller and using an MRI process, an adjustment prescan of the examination subject;

determining, by the controller, adjusted physical parameter values of the MRI scan based on the adjustment prescan;

specifying, by the controller, geometric parameter values of the MRI scan based on the adjustment prescan, the geometric parameter values including parameter values adapted to merge a field of view (FoV) of the MRI scan and an examination region of interest (ROI) to be imaged of the examination subject, wherein merging of the FoV and the examination ROI to be imaged includes localizing and/or segmenting an individual sub-object to be examined or a subregion to be examined in the examination ROI based on the adjustment prescan, and wherein a position and dimensions of the sub-object or subregion are determined; and providing, by the controller, one or more electronic signals representing the adjusted physical parameter values and the geometric parameter values.

2. The method as claimed in claim 1, wherein the adjustment prescan has a lower resolution as compared to an image acquisition for examination purposes, an image quality of the adjustment prescan being adapted to identify and localize an examination region of interest (ROI).

3. The method as claimed in claim 2, wherein performing the adjustment prescan comprises:

acquiring raw data from the examination subject, and reconstructing prescan image data of the examination subject based on the acquired raw data.

4. The method as claimed in claim 1, wherein performing the adjustment prescan comprises:

acquiring raw data from the examination subject, and reconstructing prescan image data of the examination subject based on the acquired raw data.

5. The method as claimed in claim 1, wherein the adjusted physical parameter values include adjusted image reconstruction parameter values.

6. The method as claimed in claim 5, wherein, to reconstruct examination image data of the examination subject, the adjusted image reconstruction parameter values include: correction parameter values and/or supplementary parameter values.

7. The method as claimed in claim 6, wherein:

wherein the correction parameter values include at least one of the following parameter value types: (i) $B_0$ field map data and (ii) coil sensitivity parameter values for a parallel imaging process; and/or wherein the supplementary parameter values comprise weights for calculating additional k-space data for supplementing undersampled k-space data for a parallel autocalibrated imaging procedure.

8. The method as claimed in claim 1, wherein the merging of the FoV and the examination ROI to be imaged further comprises specifying the FoV of the MRI scan and/or adjusting a position of the examination subject.

9. The method as claimed in claim 8, wherein the merging of the FoV and the examination ROI to be imaged further comprises:

identifying and localizing the examination ROI of the examination subject based on the adjustment prescan; and/or determining dimensions of the examination ROI based on the adjustment prescan.

10. The method as claimed in claim 8, wherein:

wherein specifying the FoV comprises dimensioning the FoV as a function of: the dimensions of the examination region of interest (ROI) or the position and the dimensions of the sub-object or subregion; and/or wherein adjusting the position (PO) of the examination subject (O) is performed: such that the examination ROI of the examination subject includes an isocenter of an MRI system, or as a function of the position and the dimensions of the sub-object or subregion.

11. The method as claimed in claim 1, wherein the merging of the FoV and the examination ROI to be imaged further comprises:

identifying and localizing the examination ROI of the examination subject based on the adjustment prescan; and/or determining dimensions of the examination ROI based on the adjustment prescan.

12. A magnetic resonance imaging (MRI) method, comprising:

performing the method for preparing the MRI scan according to claim 1;

acquiring, by the controller, raw data from the examination subject based on the determined geometric parameter values; and reconstructing examination image data of the examination subject based on the acquired raw data and the adjusted physical parameter values.

13. A non-transitory computer-readable storage medium with an executable program stored thereon, that when executed, instructs a processor to perform the method of claim 1.

14. A controller for a magnetic resonance imaging (MRI) system, comprising:

a determination unit adapted to determine adjusted physical parameter values of an MRI scan based on an adjustment prescan; and a specification device adapted to specify, based on the adjustment prescan, geometric parameter values of the MRI scan, the geometric parameter values including parameter values adapted to merge a field of view (FoV) of the MRI scan and an examination region of interest (ROI) to be imaged of the examination subject, wherein merging of the FoV and the examination ROI to be imaged includes localizing and/or segmenting an individual sub-object to be examined or a subregion to be examined in the examination ROI based on the adjustment prescan, and wherein a position and dimensions of the sub-object or subregion are determined.

15. A magnetic resonance imaging system comprising the controller according to claim 14.

16. A controller for a magnetic resonance imaging (MRI) system, comprising:

one or more processors; and memory storing instructions that, when executed by the one or more processors, configure the controller to:

perform, using an MRI process, an adjustment prescan of an examination subject;

determine adjusted physical parameter values of the MRI scan based on the adjustment prescan;

specify geometric parameter values of the MRI scan based on the adjustment prescan, the geometric parameter values including parameter values adapted to merge a field of view (FoV) of the MRI scan and an examination region of interest (ROI) to be imaged of the examination subject, wherein merging of the FoV and the examination ROI to be imaged includes localizing and/or segmenting an individual sub-object to be examined or a subregion to be examined in the examination ROI based on the adjustment prescan, and wherein a position and dimensions of the sub-object or subregion are determined; and provide one or more electronic signals representing the adjusted physical parameter values and the geometric parameter values.

\* \* \* \* \*